(12) United States Patent
Isobe

(10) Patent No.: US 7,924,042 B2
(45) Date of Patent: Apr. 12, 2011

(54) SEMICONDUCTOR DEVICE, AND DESIGN METHOD, INSPECTION METHOD, AND DESIGN PROGRAM THEREFOR

(75) Inventor: Shinobu Isobe, Tateyama (JP)

(73) Assignee: UMC Japan, Tateyama (JP)

( * ) Notice: Subject to any disclaimer, the term of this patent is extended or adjusted under 35 U.S.C. 154(b) by 863 days.

(21) Appl. No.: 11/509,270

(22) Filed: Aug. 24, 2006

(65) Prior Publication Data

US 2006/0288324 A1 Dec. 21, 2006

Related U.S. Application Data

(62) Division of application No. 10/681,993, filed on Oct. 8, 2003, now Pat. No. 7,103,864.

(30) Foreign Application Priority Data

Nov. 1, 2002 (JP) ................................. 2002-319849

(51) Int. Cl.
*G01R 31/02* (2006.01)
(52) U.S. Cl. ................................. 324/762.01
(58) Field of Classification Search .......... 324/754–758, 324/765; 174/255, 262; 361/795, 799
See application file for complete search history.

(56) References Cited

U.S. PATENT DOCUMENTS

| | | | |
|---|---|---|---|
| 4,621,232 A * | 11/1986 | Chang et al. | 324/751 |
| 5,155,065 A | 10/1992 | Schweiss | |
| 5,552,333 A | 9/1996 | Cheung et al. | |
| 5,640,327 A | 6/1997 | Ting | |
| 5,684,304 A * | 11/1997 | Smears | 257/48 |
| 5,899,703 A * | 5/1999 | Kalter et al. | 438/18 |
| 5,917,197 A | 6/1999 | Alswede et al. | |
| 5,981,302 A | 11/1999 | Alswede et al. | |
| 6,133,582 A * | 10/2000 | Osann et al. | 257/48 |
| 6,323,556 B2 | 11/2001 | Izumi | |

(Continued)

FOREIGN PATENT DOCUMENTS

JP 57-211744 12/1982

(Continued)

OTHER PUBLICATIONS

NN9005325, "LSSD Boundary-Scan Design System for Reduced Pin-Count Testing", IBM Technical Disclosure Bulletin, vol. 32, No. 12, May 1990, pp. 325-326 (4 pages).

(Continued)

*Primary Examiner* — Ha Tran T Nguyen
*Assistant Examiner* — Arleen M Vazquez
(74) *Attorney, Agent, or Firm* — Cohen Pontani Lieberman & Pavane LLP

(57) ABSTRACT

A design method for automatically determining layout of a multilayer semiconductor device which has circuit blocks formed on a semiconductor substrate and measurement terminals for measuring voltage, logic state, or the like, on wiring lines for connecting the circuit blocks. The method includes the steps of registering measurement terminals as cells in design rules, together with the circuit blocks wherein each measurement terminal has an electrode formed in an uppermost layer of the semiconductor device, and the measurement terminal is connectable to a wiring line for connecting any two of the circuit blocks, which is formed in any layer of the semiconductor device; planar-arranging the measurement terminals and the circuit blocks; and establishing connection of each wiring line, which extends from one of the circuit blocks, via one of the measurement terminals.

4 Claims, 7 Drawing Sheets

U.S. PATENT DOCUMENTS

| | | | |
|---|---|---|---|
| 6,348,805 B1 | 2/2002 | Jackson et al. | |
| 6,414,387 B1 | 7/2002 | Hara et al. | |
| 6,460,169 B1 | 10/2002 | Camporese et al. | |
| 6,516,446 B2 | 2/2003 | Anzai | |
| 6,539,520 B1 | 3/2003 | Tiong et al. | |
| 6,539,536 B1 | 3/2003 | Singh et al. | |
| 6,564,362 B2 | 5/2003 | Osaki et al. | |
| 6,577,149 B2 | 6/2003 | Doong et al. | |
| 6,631,504 B2 | 10/2003 | Dervisoglu et al. | |
| 6,680,484 B1 * | 1/2004 | Young | 257/48 |
| 6,747,445 B2 | 6/2004 | Fetterman et al. | |
| 6,823,501 B1 | 11/2004 | Dahl | |
| 6,823,502 B2 | 11/2004 | Wingren et al. | |
| 6,844,631 B2 * | 1/2005 | Yong et al. | 257/786 |
| 6,937,047 B2 | 8/2005 | Tran et al. | |
| 6,941,536 B2 | 9/2005 | Muranaka | |
| 6,993,731 B2 | 1/2006 | Whitaker et al. | |
| 7,000,163 B1 | 2/2006 | Dirks et al. | |
| 7,010,733 B2 | 3/2006 | Bassett et al. | |
| 7,013,438 B1 | 3/2006 | Saldanha et al. | |
| 7,017,135 B2 | 3/2006 | Takeoka et al. | |
| 7,045,719 B1 * | 5/2006 | Alexander et al. | 174/262 |
| 7,282,940 B2 * | 10/2007 | Hirai | 324/765 |
| 2001/0003368 A1 | 6/2001 | Shim et al. | |
| 2001/0021990 A1 | 9/2001 | Takeoka et al. | |
| 2001/0039642 A1 | 11/2001 | Anzai | |
| 2002/0004929 A1 | 1/2002 | Osaki et al. | |
| 2002/0089345 A1 | 7/2002 | Doong et al. | |
| 2002/0105049 A1 | 8/2002 | Barney et al. | |
| 2002/0166100 A1 | 11/2002 | Meding | |
| 2003/0082836 A1 | 5/2003 | Fetterman et al. | |
| 2005/0030055 A1 * | 2/2005 | Tran et al. | 324/763 |
| 2005/0188340 A1 | 8/2005 | Takeoka | |

FOREIGN PATENT DOCUMENTS

| | | |
|---|---|---|
| JP | 62-076736 | 4/1987 |
| JP | 64-027241 | 1/1989 |
| JP | 8-288396 | 11/1996 |
| JP | 09-139471 | 5/1997 |
| JP | 09-178774 A | 7/1997 |
| JP | 9-232314 | 9/1997 |
| JP | 2000-150599 | 5/2000 |
| TW | 434831 | 5/2001 |
| TW | 454283 | 9/2001 |

OTHER PUBLICATIONS

Caldwell et al., "Implications of area-array I/O for row-based placement methodology", 1998 IEEE Symposium on IC/Package Design Integration, Feb. 2, 1998, pp. 93-98.

Whetsel, "Improved Boundary Scan Design", Proceedings of International Test Conference, Oct. 21, 1995, pp. 851-860.

* cited by examiner

SEMICONDUCTOR DEVICE, AND DESIGN METHOD, INSPECTION METHOD, AND DESIGN PROGRAM THEREFOR

This application is a divisional of U.S. patent application Ser. No. 10/681,993 filed Oct. 8, 2003 now U.S. Pat. No. 7,103,864.

BACKGROUND OF THE INVENTION

1. Field of the Invention

The present invention relates to a semiconductor device and relates to a design method, an inspection method, and a design program therefor.

2. Description of the Related Art

FIG. 6 is a diagram showing an example of the layout for a semiconductor device, which is designed using a known automatic wiring tool. FIG. 7A is a diagram showing the wiring structure of area A1 in FIG. 6, and FIG. 7B is a sectional view along line J-J in FIG. 7A. FIG. 8A is a diagram showing the wiring structure of area A2 in FIG. 6, and FIG. 8B is a sectional view along line K-K in FIG. 8A.

In FIG. 6, reference numerals 100A to 100D indicate circuit blocks formed on a semiconductor substrate, and reference numerals 111 to 117 indicate wiring lines for connecting the circuit blocks 100A to 100D with each other. In the area A1 indicated by dashed lines, the wiring lines 111 to 113 extending in the horizontal direction on FIG. 6 intersect with the wiring lines 114 and 115 extending in the vertical direction on FIG. 6. In the area A2, the above wiring lines 114 and 115 intersect with the wiring line 117 extending in the horizontal direction on the figure, and this wiring line 117 is electrically connected to the wiring line 116 extending in the vertical direction on the figure.

As shown in FIG. 7A, the wiring lines 114 and 115 respectively have measurement electrodes 114*b* and 115*b* via extension wiring lines 114*a* and 115*a*, in a manner such that the areas of the measurement electrodes 114*b* and 115*b* do not overlap those of the wiring lines 111 to 113 in plan view.

In addition, in the wiring structure shown in FIGS. 8A and 8B, the wiring lines 114 and 115 are formed in the uppermost layer of the semiconductor device the wiring line 117 is formed between the third interlayer insulating film 103 and the second interlayer insulating film 102, and the wiring line 116 is formed between the second interlayer insulating film 102 and the first interlayer insulating film 101.

The wiring lines 116 and 117 are electrically connected to each other via a contact hole 105, which is formed through the second interlayer insulating film 102, at a position where the wiring lines 116 and 117 intersect with each other in plan view. In the uppermost layer above this intersection of the wiring lines 116 and 117, a measurement electrode 118 is formed, which is electrically connected to the wiring line 117 via a contact hole 106 formed through the third interlayer insulating film 103.

In conventional voltage or logic measurements for the inside of semiconductor devices, a thin metal needle is made to directly contact each wiring line on the surface of the semiconductor device, or secondary electrons obtained by irradiating the wiring line with an electron beam are measured. Typically, as shown in FIG. 7A, dedicated electrodes 114*b* and 115*b* for performing such a measurement are provided, and the measurement is performed via the electrodes 114*b* and 115*b*. However, in this case, each electrode is generally provided at a position which the designer believes necessary; thus, the results obtained by the automatic wiring layout tool should be manually corrected, thereby increasing labor (or man-hour). In addition, as shown in FIGS. 7A and 7B, space for forming the electrodes 114*b* and 115*b* and areas for providing the wiring lines 114*a* and 115*a* (for providing these electrodes) are also necessary.

However, in the above conventional methods of making a needle contact the wiring line or irradiating the wiring line with an electron beam, the wiring lines other than those provided in the uppermost layer cannot be measured. In order to perform the measurement for the wiring lines formed in the second or lower layers, a hole for measurement (here, the contact hole 106) is formed through the third interlayer insulating film 103 (see FIGS. 8A and 8B), so as to connect the electrode 118 to the wiring line 116, and the measurement is performed by making a probe 108 contact the electrode 118. However, in the semiconductor devices using the recent multilayer wiring technique, wiring lines are crowded and wiring density in the uppermost layer is very high; thus, it is very difficult to secure an area for providing such a measurement hole in the uppermost layer of the semiconductor device. Additionally, such an area for proving a measurement hole is manually searched for, thereby requiring a considerable amount of time.

In addition, Japanese Unexamined Patent Application. First Publication No. Sho 64-027241 discloses that a measurement terminal is provided in each unit cell of an electric circuit; however, in recent circuit design, the unit cell is generally covered with a wiring layer for a power supply or the like, and it is difficult to secure an area for providing the measurement terminal.

Japanese Unexamined Patent Application, First Publication No. Hei 9-139471 discloses using an automatic layout tool for measurement terminals; however, in the disclosed method, after completion of the wiring layout process, the layout operation is again performed by using a tool for searching for an area which satisfies specific conditions (i.e., an area where an electrode can be provided on the surface layer). In this case, if measurement terminals cannot be suitably arranged in the layout, correction of the entire design, such as reconsideration of the entire layout, is necessary. Therefore, increase in labor according to the increase in the load of simulation is inevitable, and thus it is difficult to put this method to practical use.

Japanese Unexamined Patent Application, First Publication No. Sho 62-076736discloses preparing cells in which a measurement terminal is mounted on a small-scale logic circuit, and performing connection between all cells after suitably arranging the cells in which no measurement terminal is mounted and the cells in which measurement terminals are mounted. However, in this case, each measurement terminal makes a pair with a logic circuit; thus, in the automatic wiring process, wiring cannot be produced in a layer above each circuit in the layout. In addition, the measurement terminal is not always mounted on each logic circuit (i.e., and each logic circuit in which the measurement terminal should be mounted is defined and selected; thus, it is difficult to automate the layout process.

SUMMARY OF THE INVENTION

In consideration of the above circumstances, an object of the present invention is to provide a semiconductor device design method and design program for automatically determining layout of a semiconductor device which has measurement terminals for measuring voltage, logic state, or the like, on wiring lines for connecting the circuit blocks.

Another object of the present invention is to provide a semiconductor device inspection method using measurement terminals which are arranged by the above semiconductor device design method.

Another object of the present invention is to provide a semiconductor device which is designed by the above semiconductor device design method.

Therefore, the present invention provides a design method of designing a multilayer semiconductor device which includes a plurality of circuit blocks formed on a semiconductor substrate, the method comprising the steps of:

registering measurement terminals as cells in design rules, together with the circuit blocks, wherein each measurement terminal has an electrode formed in an uppermost layer of the semiconductor device, and the measurement terminal is connectable to a wiring line for connecting any two of the circuit blocks, which is formed in any layer of the semiconductor device;

planar-arranging the measurement terminals and the circuit blocks: and establishing connection of each wiring line, which extends from one of the circuit blocks, via one of the measurement terminals.

Typically, in the step of establishing the connection of each wiring line, the connection is performed based on a net list which stores data of each measurement terminal and terminations of a wiring line on which the measurement terminal is provided.

The present invention also provides an inspection method of inspecting a multilayer semiconductor device which includes a plurality of circuit blocks formed on a semiconductor substrate, the method comprising the step of:

performing inspection via an electrode of a measurement terminal wherein the measurement terminal is provided on a wiring line which extends from one of the circuit blocks, the electrode is formed in an uppermost layer of the semiconductor device, and the measurement terminal has a pad in each of the remaining layers of the semiconductor device, and the pads are electrically connected with each other via contact holes, each contact hole passing through each insulating film of the semiconductor device.

In a preferable example, the step of performing inspection includes measuring at least one of voltage and logic state of the wiring line on which the measurement terminal is provided, by one of making a probe contact the electrode of the measurement terminal and irradiating the electrode with an electron beam.

The present invention also provides a design program for making a computer execute an operation of designing a multilayer semiconductor device which includes a plurality of circuit blocks formed on a semiconductor substrate, the operation comprising the steps of:

registering measurement terminals as cells in design rules, together with the circuit blocks, wherein each measurement terminal has an electrode formed in an uppermost layer of the semiconductor device, and the measurement terminal is connectable to a wiring line for connecting any two of the circuit blocks, which is formed in any layer of the semiconductor device;

planar-arranging the measurement terminals and the circuit blocks; and establishing connection of each wiring line, which extends from one of the circuit blocks, via one of the measurement terminals.

The present invention also provides a multilayer semiconductor device which includes a plurality of circuit blocks formed on a semiconductor substrate, the semiconductor device comprises:

measurement terminals, each provided on a wiring line which extends from one of the circuit blocks, wherein each measurement terminal has an electrode formed in an uppermost layer of the semiconductor device and a pad provided in each of the remaining layers of the semiconductor device, and the electrode and the pads are connected with each other via contact holes.

Typically, the positions of the electrode and the pads are substantially the same in plan view.

According to the design method of the present invention, it is possible to very efficiently design a semiconductor device having measurement terminals for performing electrical measurement which is performed for analyzing the semiconductor device. The measurement terminals can be automatically arranged using an automatic arrangement tool; thus, the measurement terminals can function as a device for verification performed during design and trial manufacture of the semiconductor device or a measurement and analysis device for quickly analyzing a problem which may appear when the semiconductor device is arranged in a functional system. Therefore, it is possible to considerably reduce the design time. In addition, it is possible to directly observe a portion having a problem, which is actually found by verification, so that a concrete measure for solving the problem can be determined and time necessary for determining such a concrete measure can be reduced.

DESCRIPTION OF THE PREFERRED EMBODIMENTS

Hereinafter, embodiments according to the present invention will be explained with reference to the drawings; however, the present invention is not limited to these embodiments.

Figure 1:
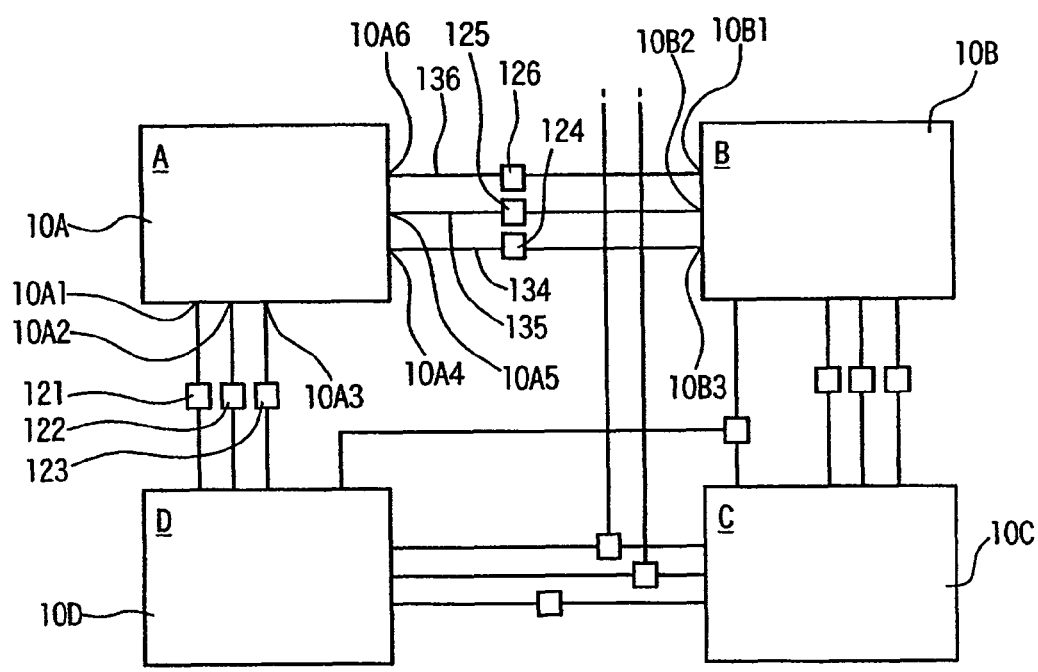
FIG. 1 is a diagram showing an example of the layout of a semiconductor device, which is designed according to the design method of the present invention.

FIG. 1 is a diagram showing an example of the layout of a semiconductor device, which is designed according to the design method of the present invention. The semiconductor device shown in FIG. 1 has circuit blocks 10A to 10D provided at four corners in the figure, wiring lines extending from each circuit block, and measurement terminals provided on the wiring lines (some of the measurement terminals are indicated by reference numerals 121 to 126). Each of the measurement terminals has a measurement electrode which a probe can contact or which can be irradiated with an electron beam, so as to perform electrical measurement on the uppermost layer of the semiconductor device.

In FIG. 1, the circuit block 10A is electrically connected to the circuit block 10B via the wiring lines 134 to 136. More specifically, the terminal 10A6 of the circuit block 10A is connected to the terminal 10B1 of the circuit block 10B via the wiring line 136, and this wiring line 136 electrically connects the circuit blocks 10A and 10B via the measurement terminal 126. The wiring line 134 also electrically connects the circuit blocks 10A and 10B via the measurement terminal 124, and the wiring line 135 also electrically connects the circuit blocks 10A and 10B via the measurement terminal 125. The terminals 10A1 to 10A3 of the circuit block 10A are connected to the circuit block 10D via wiring lines on which the measurement terminals 121, 122, and 123 are respectively provided.

In the semiconductor device of FIG. 1, the wiring lines extending from the circuit blocks 10A to 10D are connected via the measurement terminals; thus, it is possible to very easily perform measurement of the voltage or logic state of each wiring line.

When a problem of any wiring line is found by the measurement, the relevant wiring path is traced and detailed inspection can be performed before or after the relevant circuit block; thus, a defective portion can be directly and easily checked, thereby performing high-speed analysis and reducing the design period of the semiconductor device.

Figure 2:
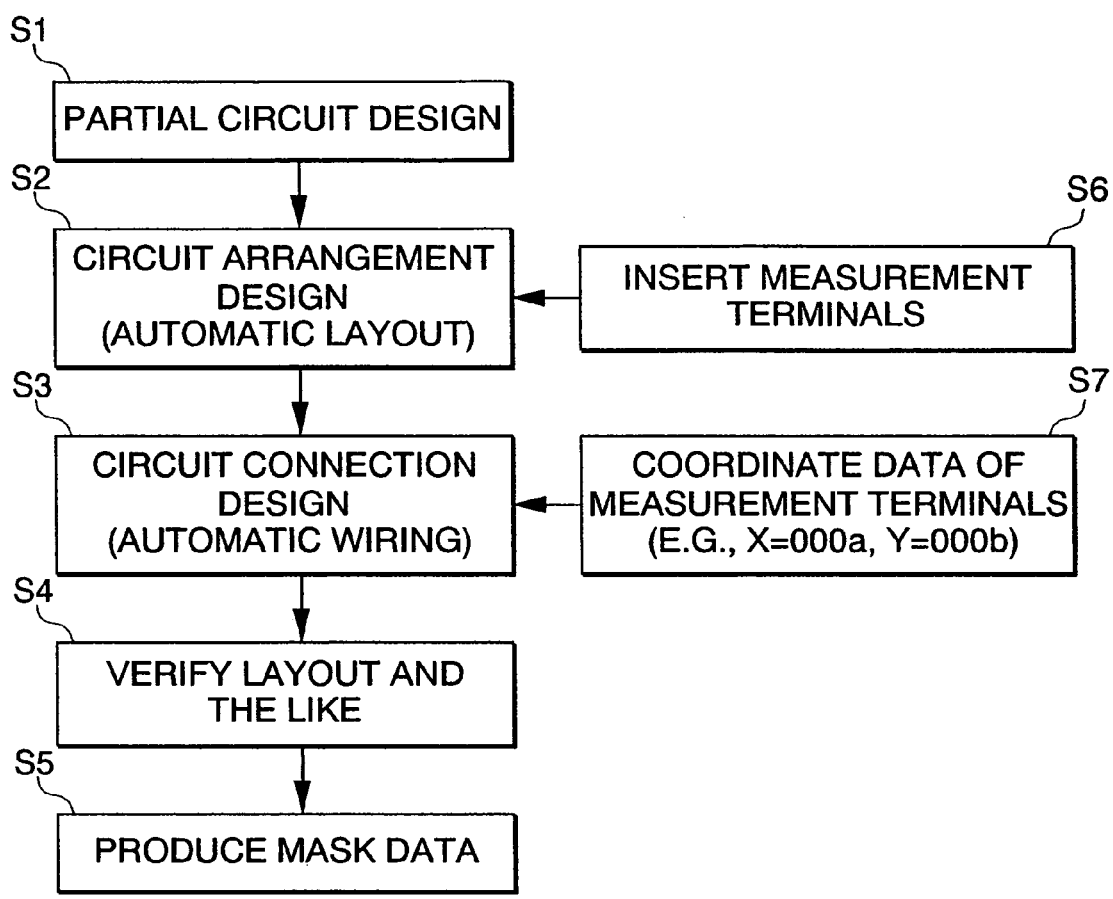
FIG. 2 is a flowchart for explaining the design method according to the present invention.

The semiconductor device having the structure as shown in FIG. 1 may be designed by the design method explained below. FIG. 2 is a flowchart for explaining the design method according to the present invention.

As is generally known, in the design of the semiconductor device, a partial circuit having a specific function is designed in each block, and then a chart for connecting inputs and outputs of each circuit (called a "net list") is produced, and a design diagram for manufacturing (i.e., a layout diagram) is produced based on the net list. In the manufacturing of the semiconductor devices, a photomask is produced according to the produced layout diagram, and each layer (for providing transistors wiring lines insulating films, or the like) of the semiconductor device is printed on a silicon wafer.

The basic procedure of the design method of the present embodiment is similar to that of the above-explained known design method. That is, as shown in FIG. 2, design of partial circuits (such as circuit blocks and the like) is performed (see step S1), and then circuit arrangement design for producing planar arrangement of the circuit blocks is performed (see step S2). After step S2, circuit connection design for connecting the circuit blocks via wiring lines is performed (see step S3), thereby producing a layout diagram of a semiconductor device (see, for example, FIG. 1). After that, the produced layout diagram is verified (see step S4), and then a mask data is produced (see step S5).

Figure 3:
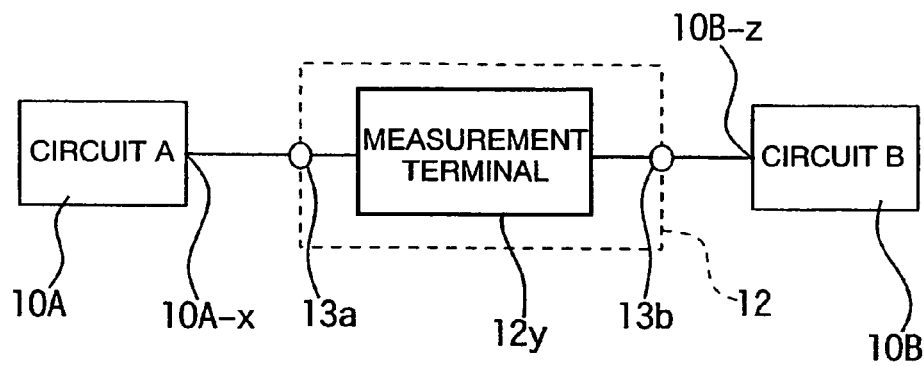
FIG. 3 is a diagram showing an example of the cell which is registered in the net list in the circuit arrangement design process.

The design method of the present embodiment also has a distinctive step (see step S6) which is not included in the conventional method, that is, in step S2 of the circuit arrangement design, the measurement terminals are registered as cells similar to the circuit blocks, so as to perform the automatic layout operation (see step S6). In order to register the measurement terminals as cells, a cell having a structure shown in FIG. 3 may be employed. In FIG. 3, the measurement terminal cell 12 has the main body 12y of the measurement terminal and connecting terminals 13a and 13b (as terminations of the cell) which are connected to the main body 12y via wiring lines. Each of the connecting terminals 13a and 13b is provided for designating connection between wiring lines in the design using an automatic wiring tool or the like, and thus these connecting terminals are not present in the actual semiconductor device. Additionally, FIG. 3 shows an example in which two wiring lines extend from the main body 12y of the measurement terminal; however, one, or three or more wiring lines may be connected to the main body 12y of the measurement terminal.

As the circuit blocks used in the automatic layout, each of the circuits, of any scale, from small-scale NAND, OR circuits, and the like, to large-scale operational circuits, memories, and the like, can be registered as a single circuit block (i.e., a cell), and each wiring line between the blocks is arranged in a manner such that a measurement terminal is provided on the wiring line.

More specifically, in step S2 of the circuit arrangement design in FIG. 2, the measurement terminal cell 12 is arranged, for example, between the circuit blocks 10A and 10B, and in the following step S3 of the circuit connection design, as shown in FIG. 3, the wiring line extended from the terminal 10A-x of the circuit block 10A is connected to the main body 12y of the measurement terminal via the connecting terminal 13a, and the wiring line extended from the terminal 10B-z of the circuit block 10B is connected to the main body 12y of the measurement terminal via the connecting terminal 13b. That is, in the net list used for connecting the wiring lines in the circuit connection design step of the present embodiment, each line of the list includes a measurement terminal between the terminals of the circuit blocks to be connected with each other, for example, "output x of circuit A—measurement terminal y—input z of circuit B" (this example corresponds to the diagram of FIG. 3).

Also in the design method of the present embodiment, in step S3 of the circuit connection design, coordinate data of the measurement terminals can also be stored (see step S7). When the coordinate data of the measurement terminals are stored, data of wiring connection between the circuit blocks based on the net list and the position data of each measurement terminal between the circuit blocks can be used in the inspection of the semiconductor device. In addition, the stored coordinate data can also be used in an automatic verification device for verifying the semiconductor device based on the measurement path and the position of each measurement terminal.

A specific example of the process for verifying an output of the circuit block will be explained with reference to FIG. 1. In order to verify an output from the terminal 10A6 of the circuit block 10A, measurement is performed using the measurement terminal 126 based on the wiring connection data obtained by the net list, so that data (i.e., a logic value) according to an estimated operation (which is estimated in the logic design) is compared with data (i.e., an actual value) indicating the actually-measured logic state. In this process, if the compared data do not coincide with each other, it is estimated that the circuit block A has a problem, or the circuit block 10D positioned before the circuit block 10A has a problem. Therefore, in the next step measurement is performed using the measurement terminal 121 provided on the input path from the circuit block 10D to the circuit block 10A, and comparison with the logic value is also performed. If the actually measured value and the logic value coincide with each other, it is determined that the circuit block 10A has a problem, and if the actually measured value and the logic value do not coincide with each other, it is determined that the circuit block 10D or a previous circuit block has a problem. Accordingly, the portion having a problem can be very precisely determined by performing measurements along each wiring path between the circuit blocks.

Therefore, when the semiconductor device is analyzed, each measurement terminal to be used in the inspection or measurement can be easily known by referring to the net list, and the position data of the measurement terminal can also be easily obtained. Therefore, high-speed and efficient analysis can be performed.

In the above-explained design method for semiconductor devices, almost all steps can be automatically performed by making a computer execute a semiconductor device design program having the following steps. That is, the design program should include a step of arranging the measurement terminals which are registered in the design rules (i.e., the net list) as cells, together with the circuit blocks and the like, and a step of producing wiring between the circuit blocks and the measurement terminals, which are planar-arranged.

Figure 4A:
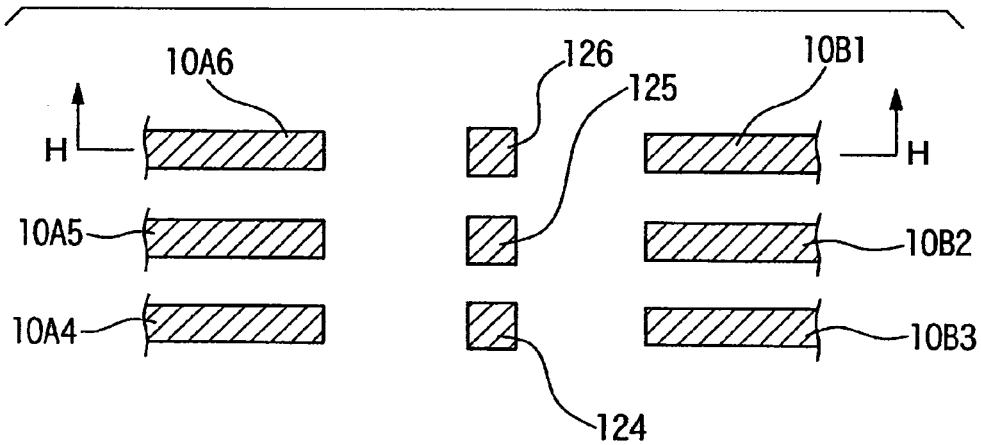
FIG. 4A is a plan view showing a structure in which some of the circuit blocks and the measurement terminals in FIG. 1 are planar-arranged according to the design method of the present invention.
Figure 4B:
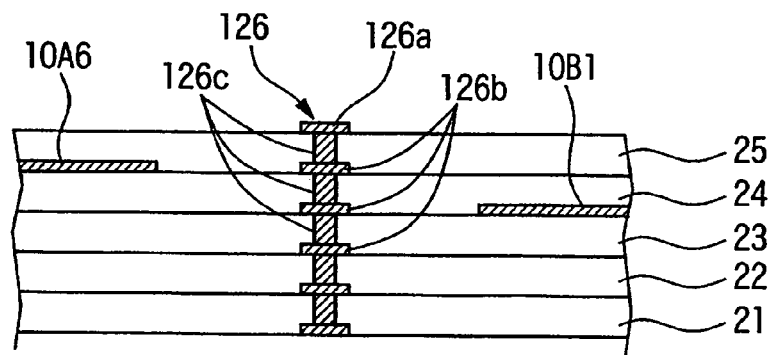
FIG. 4B is a sectional view along line H-H in FIG. 4A.
Figure 5A:
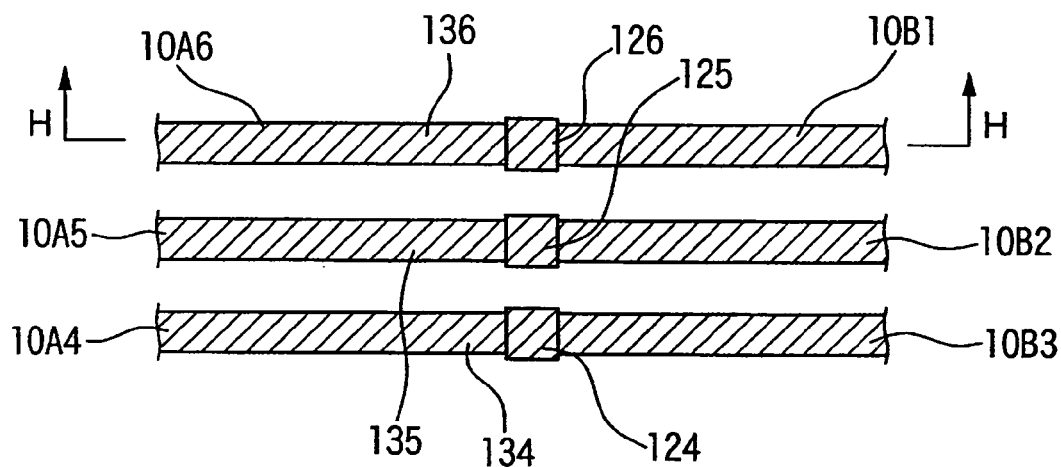
FIG. 5A is a plan view showing a state in which the circuit blocks and the measurement terminals in FIG. 4 are connected according to the design method of the present invention.
Figure 5B:
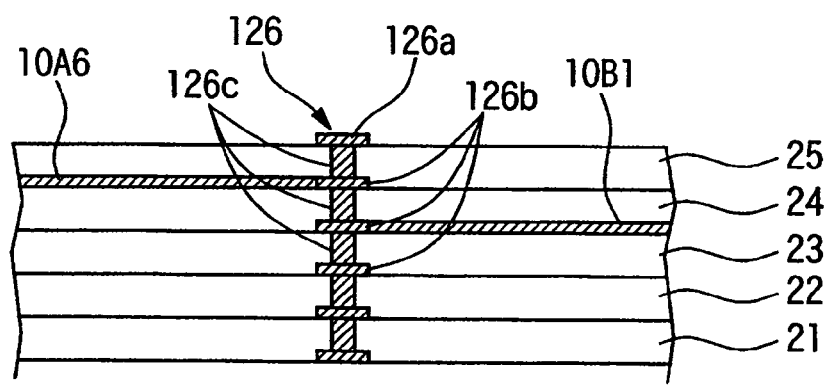
FIG. 5B is a sectional view along line H-H in FIG. 5A.
Figure 6:
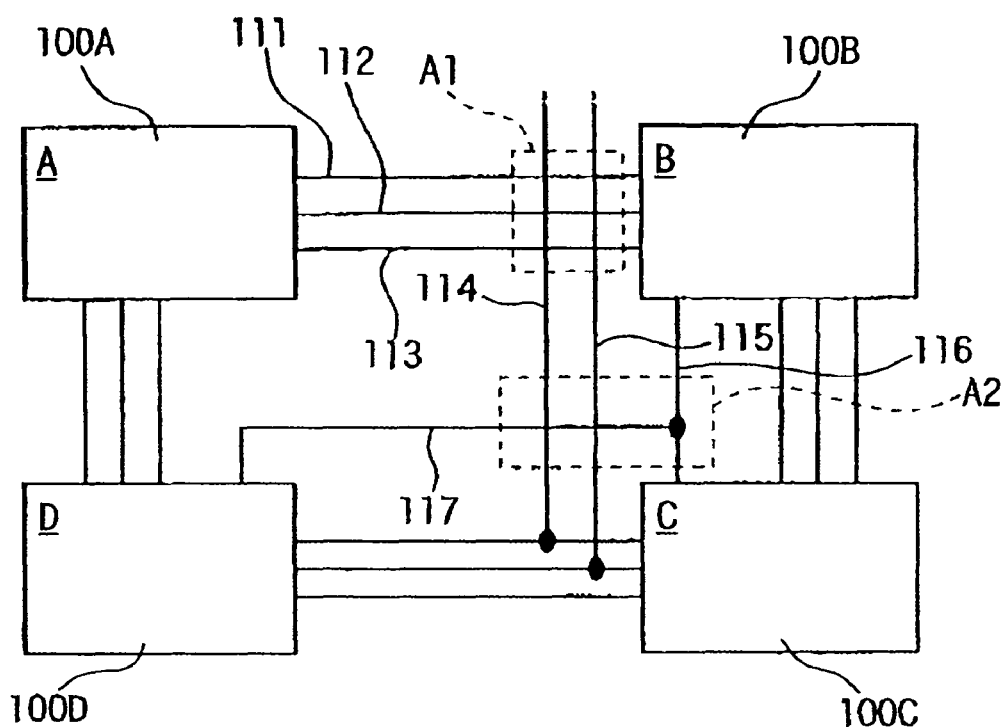
FIG. 6 is a diagram showing an example of the layout for a semiconductor device, which is designed using a known automatic wiring tool.
Figure 7A:
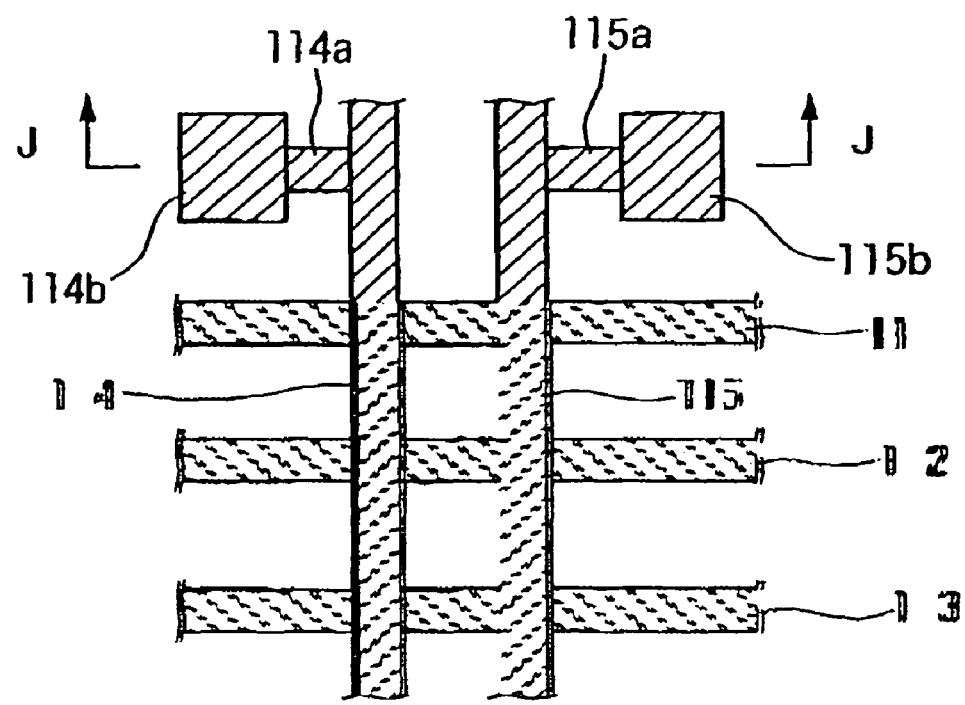
FIG. 7A is a diagram showing the wiring structure of area A1 in FIG. 6.
Figure 7B:
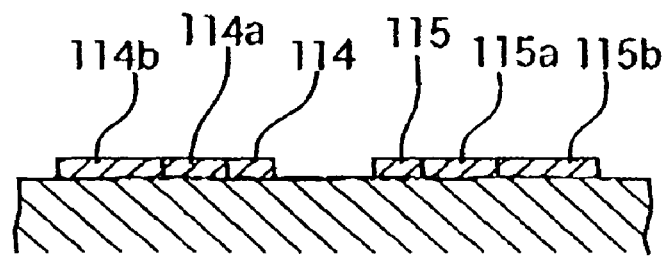
FIG. 7B is a sectional view along line J-J in FIG. 7A.
Figure 8A:
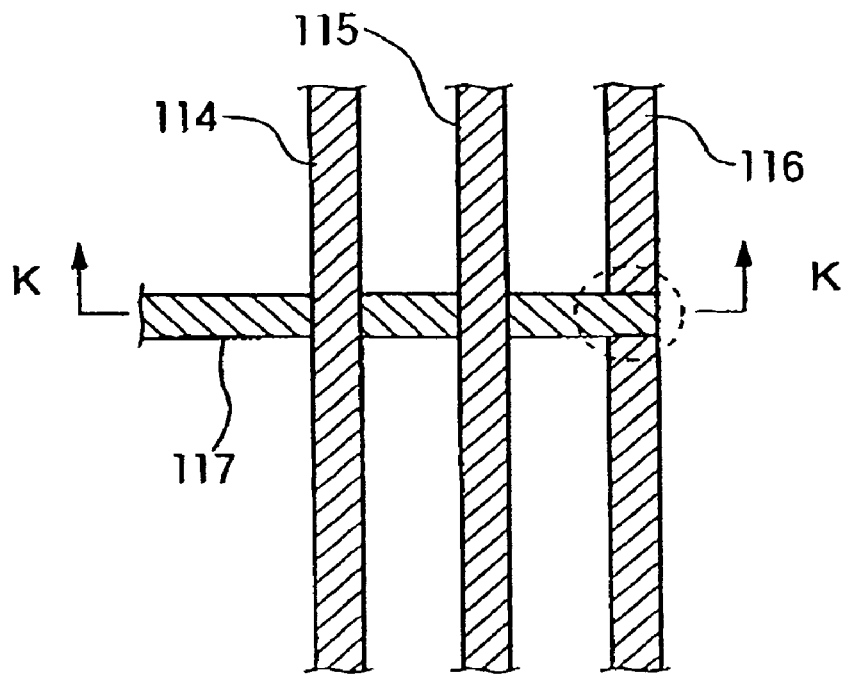
FIG. 8A is a diagram showing the wiring structure of area A2 in FIG. 6.
Figure 8B:
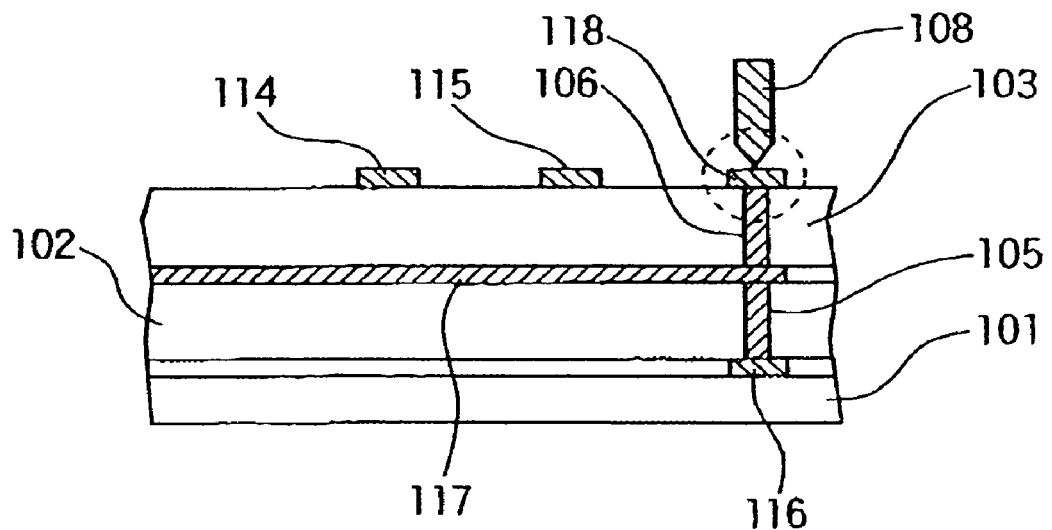
FIG. 8B is a sectional view along line K-K in FIG. 8A.

The above-explained design method will be explained in more detail, with reference to FIGS. 4A to 5B, by referring to an actual structure of the semiconductor device. FIG. 4A is a plan view showing the structure in which the circuit blocks 10A and 10B and the measurement terminals 124 to 126 in FIG. 1 are planar-arranged according to the above-explained design method. FIG. 4B is a sectional view along line H-H in FIG. 4A. FIGS. 5A and 5B are a plan view and a sectional view, respectively corresponding to FIGS. 4A and 4B, showing the structure after the wiring connection which is performed after the circuit arrangement design shown in FIGS. 4A and 4B.

As shown in FIG. 4A, in the step of the circuit arrangement design of the design method in the present embodiment, the measurement terminals 124 to 126 are provided between the terminals 10A4 to 10A6 of the circuit block 10A and the terminals 10B3 to 10B1 (which are respectively connected to the terminals 10A4 to 10A6) of the circuit block 10B, according to the above-explained net list. The measurement terminals 124 to 126 have a similar structure, and the structure of the measurement terminal 126 will be representatively explained. As shown in FIG. 4B, the measurement terminal 126 has a measurement electrode 126a in the uppermost layer of the multilayer semiconductor device, and pads 126b provided in each layer between the first to fifth inter-layer insulating films 21 to 25. The measurement electrode 126a and the pads 126b are provided at the substantially same position in plan view. The adjacent pads are electrically connected via a contact hole 126c which is formed through the inter-layer insulating film between the pads. In addition, the terminal 10A6 of the circuit block 10A is formed between the fifth inter-layer insulating film 25 and the fourth inter-layer insulating film 24, and the terminal 10B1 of the circuit block 10B is formed between the fourth inter-layer insulating film 24 and the third inter-layer insulating film 23.

According to the step S3 of the circuit connection design for performing wiring between the circuit blocks and the measurement terminals, the wiring lines 134 to 136 for connecting the circuit blocks 10A and 10B via the measurement terminals 124 to 126 are formed, as shown in FIGS. 5A and 5B. As shown in FIG. 5B, the measurement terminal 126 has the pad 126b in each layer of the semiconductor device; thus, the terminals 10A6 and 10B1, which are formed in different layers, can be electrically connected by simply forming a wiring line which passes the measurement terminal 126. Therefore, whichever layer (of the semiconductor device) the wiring line for connecting the circuit blocks is formed, electrical measurement can be performed via an electrode formed on the surface of the measurement terminal.

In addition, the measurement terminal has a structure in which the contacts (i.e., the contact holes) are stacked (see FIG. 4B). In this case, even when the measurement terminal is provided in the middle of the wiring line, the influence of increase in wiring capacity or variation of impedance can be small.

As explained above, the present embodiment employs the measurement terminals which have a structure as shown in FIGS. 4A to 5B; thus, the measurement electrode (see 126a) can be provided on the uppermost layer of the semiconductor device, and wiring connection can be performed in any layer of the semiconductor device, and in addition, the occupied area of the measurement terminal in each layer can be minimized. The measurement electrode should occupy a small area to which a measurement probe can contact; thus, the width of the measurement electrode can be reduced to the width of the wiring line. Therefore, even when high-density wiring having the wiring density as high as that of the conventional wiring is performed, integration degree of the semiconductor device is not influenced. Accordingly, there are fewer limitations on the layout and the design method of the present embodiment can be automated, so that a large number of measurement terminals can be provided at once.

Also in the present design method, each measurement terminal is handled as a cell to be automatically arranged. Therefore, the position of each measurement terminal in plan view can be secured in the automatic arrangement process before the wiring between the circuits is performed. Accordingly, in comparison with the conventional method in which an area for providing each measurement terminal is searched for after the wiring process, the semiconductor device having measurement terminals can be very efficiently designed.

Additionally, in the conventional method in which each hole for measurement is formed in an area on which no wiring line passes, it is necessary that no wiring line pass above a target portion of each wiring line to be measured. In this case, in order to find an area which satisfies the above condition, complicated manual operation should be performed, and if no area which satisfies the condition is found, the entire wiring layout must be reconsidered. However, in the design method according to the present invention, measurement terminals are arranged before the wiring process; thus, the measurement electrode for each measurement terminal is always exposed on the surface of the semiconductor device, so that no manual operation (for searching a target area) as explained above is necessary.

Furthermore, in the present method, the measurement terminal can be provided on each wiring line for connecting the circuit blocks, or the like. Therefore, electrical measurement for verifying or analyzing the semiconductor device can be performed by tracing the wiring lines between the circuit blocks in turn. Accordingly, a portion having a problem can be accurately and quickly determined. In addition, the coordinate data of each measurement terminal can be stored as explained above; thus, it is possible to efficiently perform determination of the position of a measurement probe on the measurement terminal, or the like.

Therefore, when the design method of the present invention is applied to recent semiconductor devices in which an enormous number of circuits are integrated by fine-pattern processing, and thus it is very difficult to determine which portion has a problem, the analysis of the semiconductor device can be accurately performed, and the time necessary for the analysis can be considerably reduced, thereby reducing the design time.

What is claimed is:

1. An inspection method of inspecting a multilayer semiconductor device which includes a plurality of circuit blocks which include individual functions of the semiconductor device and are formed on a semiconductor substrate, the method comprising the step of:

performing inspection with an electrode of a measurement terminal, wherein the measurement terminal is provided on a wiring line which extends from one of the plurality of circuit blocks which include the individual functions of the semiconductor device, the electrode being formed in an uppermost layer of the semiconductor device, and the measurement terminal including a pad in each remaining layer of the semiconductor device, and pads in each remaining layer of the semiconductor device being electrically connected with each other by contact holes which pass through each insulating film of the semiconductor device.

2. The inspection method as claimed in claim 1, wherein the step of performing inspection includes measuring at least one of a voltage and a logic state of the wiring line on which the measurement terminal is provided, by one of contacting the electrode of the measurement terminal with a probe and irradiating the electrode with an electron beam.

3. A multilayer semiconductor device which includes a plurality of circuit blocks which include individual functions of the semiconductor device, the circuit blocks being formed on a semiconductor substrate, wherein the semiconductor device is inspected the inspection method in accordance with claim 1, the semiconductor device comprising:

measurement terminals, each provided on the wiring line which extends from one of the plurality of circuit blocks which include the individual functions of the semiconductor device, wherein each measurement terminal has an electrode formed in an uppermost layer of the semiconductor device and a pad provided in each remaining layer of the semiconductor device, and the electrode and the pads are connected with each other by the contact holes.

4. The multilayer semiconductor device as claimed in claim 3, wherein positions of the electrode and the pad provided in each remaining layer are substantially the same in plan view.

* * * * *